United States Patent
Colombeau et al.

(10) Patent No.: US 8,354,321 B2
(45) Date of Patent: Jan. 15, 2013

(54) METHOD FOR FABRICATING SEMICONDUCTOR DEVICES WITH REDUCED JUNCTION DIFFUSION

(75) Inventors: Benjamin Colombeau, Singapore (SG); Sai Hooi Yeong, Singapore (SG); Francis Benistant, Singapore (SG); Bangun Indajang, Singapore (SG); Lap Chan, Singapore (SG)

(73) Assignees: GLOBALFOUNDRIES Singapore Pte. Ltd., Singapore (SG); National University of Singapore, Singapore (SG)

( * ) Notice: Subject to any disclaimer, the term of this patent is extended or adjusted under 35 U.S.C. 154(b) by 0 days.

(21) Appl. No.: 13/277,197

(22) Filed: Oct. 19, 2011

(65) Prior Publication Data
US 2012/0034745 A1    Feb. 9, 2012

Related U.S. Application Data

(63) Continuation of application No. 11/862,213, filed on Sep. 27, 2007, now Pat. No. 8,053,340.

(51) Int. Cl.
*H01L 21/336* (2006.01)
*H01L 21/76* (2006.01)

(52) U.S. Cl. .............. 438/289; 438/527; 257/E21.334; 257/E21.409

(58) Field of Classification Search .................. 438/289, 438/527; 257/E21.334, E21.409
See application file for complete search history.

(56) References Cited

U.S. PATENT DOCUMENTS

| | | |
|---|---|---|
| 7,071,069 B2 | 7/2006 | Tan et al. |
| 7,169,675 B2 | 1/2007 | Tan et al. |
| 2003/0013260 A1 | 1/2003 | Gossmann et al. |
| 2006/0006427 A1 | 1/2006 | Tan et al. |
| 2007/0284615 A1 | 12/2007 | Ku et al. |
| 2008/0090392 A1 | 4/2008 | Singh et al. |
| 2008/0157383 A1 | 7/2008 | Lim et al. |
| 2009/0057678 A1 | 3/2009 | Goldbach et al. |

OTHER PUBLICATIONS

Cowern, N.E.B et al., Understanding, Modeling and Optimizing Vacancy Engineering for Stable Highly Boron-Doped Ultrashallow Junctions, Electron Devices Meeting, 2005. IEDM Technical Digest. IEEE International Volume , Issue , Dec. 5-7, 2005 p. 4 pp.

A.E. Michel et al., Rapid Annealing and the Anomalous Diffusion of Ion Implanted Boron into Silicon, Appl. Phys, Lett 50(7) Feb. 16, 1987, p. 416-418, vol. 50, No. 7, American Institute of Physics.

*Primary Examiner* — David S Blum
(74) *Attorney, Agent, or Firm* — Horizon IP Pte Ltd

(57) ABSTRACT

A transistor which includes halo regions disposed in a substrate adjacent to opposing sides of the gate. The halo regions have upper and lower regions. The upper region is a crystalline region with excess vacancies and the lower region is an amorphous region. Source/drain diffusion regions are disposed in the halo regions. The source/drain diffusion regions overlap the upper and lower halo regions. This architecture offers the minimal extension resistance as well as minimum lateral diffusion for better CMOS device scaling.

20 Claims, 7 Drawing Sheets

METHOD FOR FABRICATING SEMICONDUCTOR DEVICES WITH REDUCED JUNCTION DIFFUSION

CROSS REFERENCE TO RELATED APPLICATIONS

This application is a continuation application which claims benefit of U.S. patent application Ser. No. 11/862,213, now U.S. Pat. No. 8,053,340, filed on Sep. 27, 2007. The aforementioned application is incorporated herewith by reference in their entirety.

TECHNICAL FIELD

The present invention relates to methods for fabricating integrated circuits, and more particularly to transistor junction regions.

BACKGROUND ART

Integrated circuits (ICs) comprising many tens of thousands of semiconductor devices including field effect transistors (FETs) are a cornerstone of modern microelectronic systems. The various regions of the FETs (e.g. source/drain and source/drain extensions) are formed by introducing dopant atoms into a semiconductor substrate using methods such as ion implantation and indiffusion. After the dopants have been introduced, they are electrically activated by subjecting the semiconductor substrate to one or more anneal processes such as low temperature thermal anneal, rapid thermal anneal, spike anneal, flash anneal or laser anneal.

Unfortunately, during the anneal process, the dopants have a tendency to diffuse or expand both laterally and vertically away from the profile as-introduced thereby increasing the dimensions of the various device regions. This diffusion is undesirable particularly as semiconductor devices are scaled down in size.

For example, as the gate length of FETs is scaled down for example to 45 nm and beyond, the source and drain regions increasingly interact with the channel and gain influence on the channel potential. As a result, the gate electrode has reduced control over the on and off states of the channel. This effect is known as the short channel effect. In order to reduce the short channel effect, it is desirable to fabricate MOS devices with shallower source/drain extension and/or source/drain junctions and also reduce the lateral extension of the source/drain extension and/or source/drain regions after anneal.

In addition to the above, the level of dopant activation is also a critical factor as device dimensions are scaled down. This is because the resistance of the various regions e.g. source/drain (S/D) region increase as they are shrunk in size. Since an increase in the level of dopant activation leads to a decrease in resistance, a higher level of dopant activation is desirable.

In view of the above discussion, there is a need for fabrication techniques that can at least partly mitigate the problems of limiting extent of dopant diffusion and increasing the level of dopant activation.

SUMMARY OF THE INVENTION

The present invention relates to methods of fabricating diffusion regions in semiconductor devices. At least one or more of the above mentioned problems are mitigated by forming a halo region comprising a crystalline upper vacancy rich region and a lower buried amorphous region in the substrate. A first diffusion region overlapping both the upper vacancy rich region and the lower buried amorphous region is subsequently formed.

In accordance with a first aspect of the invention, a method for fabricating a semiconductor device is disclosed. The method includes providing a substrate and a gate stack on the substrate. A halo implant is performed to form a halo region in the substrate adjacent to opposing sides of the gate stack. The halo region comprises a crystalline upper vacancy rich region having excess vacancies and a lower buried amorphous region. The method further comprises forming a first diffusion region overlapping both the upper vacancy rich region and the lower buried amorphous region and recrystallizing the buried amorphous region. Dopants in the first diffusion region are activated wherein having excess vacancies in the vacancy rich region improves the electrical activation of the first diffusion region.

A method for fabricating a semiconductor device is presented in accordance with a second aspect of the invention. The method comprises providing a substrate and a gate stack on the substrate. A halo implant is performed where dopants are injected into the substrate at an angle to an axis transverse to the surface of the substrate. The halo implant forms a halo region in the substrate adjacent to opposing sides of the gate stack. The halo region comprises a crystalline upper vacancy rich region having excess vacancies and a lower buried amorphous region. The method further comprises forming a source/drain extension region substantially within each of the halo region. The substrate is annealed to activate the dopants in the first diffusion region and recrystallize the buried amorphous region, wherein having excess vacancies in the vacancy rich region improves the electrical activation of the first diffusion region.

A transistor in accordance with another aspect of the invention is disclosed. The transistor comprises a gate stack disposed above the surface of a substrate. The transistor includes halo regions in the substrate on opposing sides of the gate stack. The halo region at an initial stage comprises upper and lower regions. The upper region comprises a crystalline region having excess vacancies and the lower region comprises an amorphous region. The transistor further includes source/drain diffusion regions disposed in the halo regions adjacent to the gate stack. The source/drain diffusion regions comprise a depth which is below an interface of the upper and lower regions, wherein the upper region reduces transient enhanced diffusion.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

In the drawings, like reference numbers generally refer to the same parts throughout the different views. Also, the drawings are not necessarily to scale, emphasis instead generally being placed upon illustrating the principles of the invention. In the following description, embodiments of the invention will now be described, by way of example with reference to the drawings of which.

BEST MODE FOR CARRYING OUT THE INVENTION

The fabrication of the preferred embodiments is discussed in detail below. It should be appreciated, however, that the present invention provides many applicable inventive concepts that are embodied in a wide variety of specific contexts. The specific embodiments discussed are merely illustrative of specific ways to make and use the invention, and do not limit the scope of the invention.

FIGS. 1-5 are cross-sectional views illustrating process steps for fabricating a field effect transistor (FET) in accordance with a preferred embodiment of the present invention. For the purposes of illustration, the succeeding drawings will describe a process of forming a PFET. However, it is to be appreciated that the present invention is equally applicable to the formation of an NFET, or other types of devices.

Figure 1:
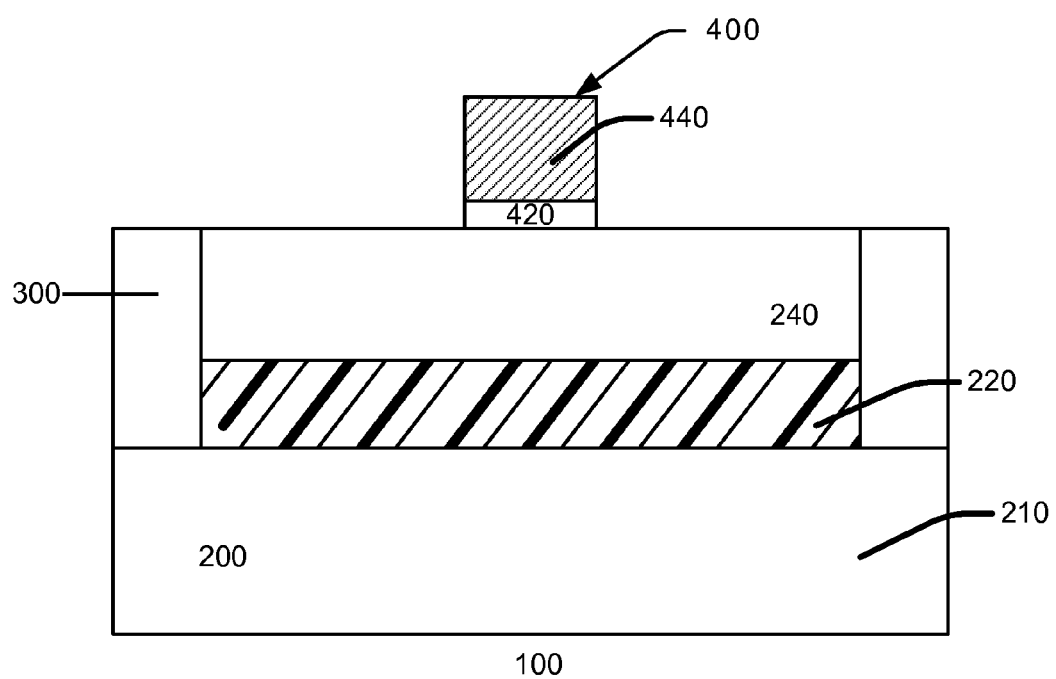
FIGS. 1 to 5 are schematic cross-sectional views illustrating the results of progressive stages in fabricating a semiconductor device in accordance with a preferred embodiment of the invention.

FIG. 1 shows a schematic cross-sectional view of a semiconductor structure 100 at an early stage of fabrication thereof in accordance with the preferred embodiment. The cross-sectional view shows a semiconductor substrate 200 comprising a base semiconductor substrate 210, an insulating layer 220 formed thereon and a crystalline active region 240 above the insulating layer 220. Isolation structures 300 in the form of trench isolation structures are provided in the substrate to isolate active regions 240 in the substrate 200. In one embodiment, the isolation structures 300 extend from the surface of the substrate 200 to the lower boundary of the insulating layer 220. A gate stack 400 comprising a gate dielectric 420 and a gate electrode 440 is formed upon the substrate 200.

Each of the foregoing semiconductor substrate 200, isolation structures 300 and gate stack 400 are generally conventional in the semiconductor fabrication art.

For example, in the presently described embodiment, the semiconductor substrate 200 is a silicon-on-insulator comprising a base silicon substrate 210, an insulating layer comprising materials such as but not limited to oxide, nitride or oxynitride and an uppermost active region 220 of crystalline silicon where devices are fabricated. Alternatively, other heterogeneous substrates with an active region overlying a buried insulating layer such as silicon-on-nothing substrate where the insulating layer is a bubble of empty space are also suitable.

Additionally, although not illustrated in the accompanying figures, the invention is also applicable to bulk semiconductor substrates comprising a semiconductor material or a compound semiconductor material. Non-limiting examples of semiconductor materials include silicon, germanium, silicon carbide and non-limiting examples of compound semiconductor materials include gallium arsenide, indium arsenide materials.

The isolation structures 300 may comprise shallow trench isolations or other isolation structures such as field oxide regions that are suitable for isolating active regions in the substrate.

The gate dielectric 420 comprises a dielectric material such as silicon dioxide, silicon oxynitride, silicon nitride, a high-K metal oxide or a combination thereof or the like. The gate dielectric may be deposited using methods such as thermal oxidation, chemical vapour deposition, rapid thermal oxidation or the like as known in the art. The gate electrode 440 comprises a conductive or semi-conductive material. Non-limiting examples include a metal (e.g. tantalum, titanium, aluminum), doped polysilicon, a metal silicide or a combination thereof. Other gate structures apart from that illustrated are also possible.

Figure 2:
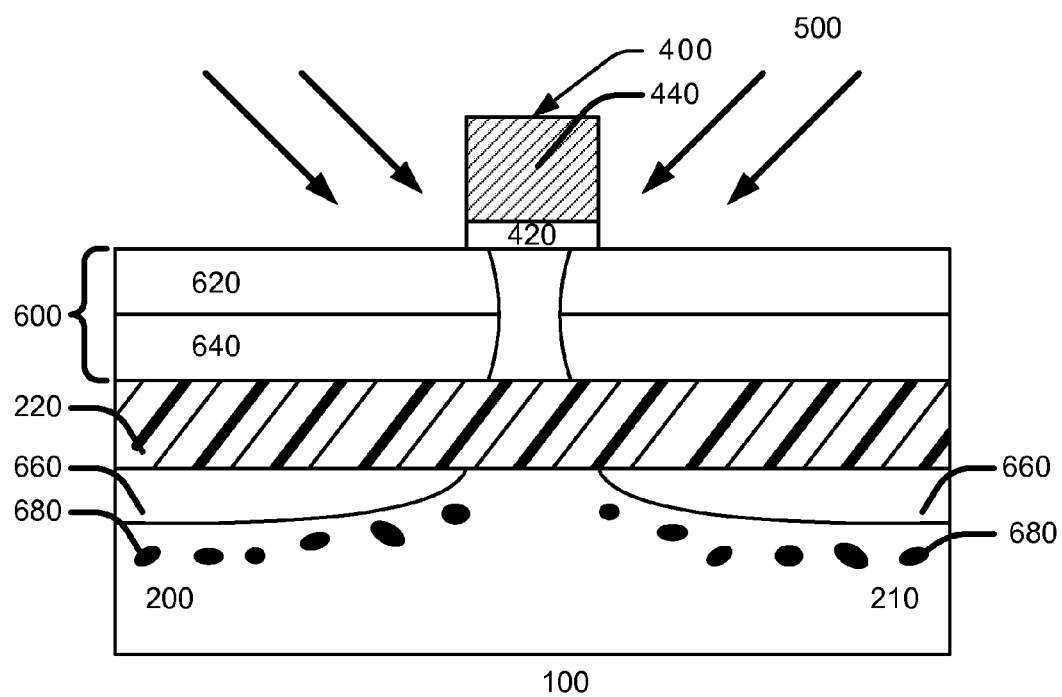

FIG. 2 shows the results of subjecting the semiconductor structure 100 of FIG. 1 to a halo implant 500 so that a halo region 600 is formed in the active region 240 of the substrate on opposite sides of the gate stack 400. In the presently described embodiment, dopant ions are injected into the substrate at an angle to an axis transverse to the surface of the substrate 200 during the halo implant 500. Therefore, as illustrated in FIG. 2, the halo region 600 as implanted extends under the gate stack 400.

Halo regions are commonly formed in the art by implanting into the substrate a dopant of opposite conductivity type to that used for the subsequently formed source/drain and source/drain extension regions. By way of example, in a p-type FET (pFET), the source and drain extensions may be made by implanting a substrate with an n-type dopant such as arsenic or phosphorous. Halo regions in this device would be formed by implanting the substrate with a p-type dopant such as boron. The purpose of forming halo regions is to suppress 'punchthrough', one of several short channel effects that degrade the performance of the device. Punchthrough occurs when the channel length of the device is sufficiently short to allow the depletion regions at the ends of the source and drain extensions to overlap, leading to a breakdown condition.

The halo region 600 in FIG. 2 comprises an upper vacancy rich region 620 that is substantially crystalline and a lower buried amorphous region 640. The vacancy rich region 620 represents a region in which there are an excess number of vacancies. In one embodiment, the vacancy rich region 620 has a vacancy concentration of between about 1E20 to 1E21 vacancies/cm$^3$. Other vacancy concentrations are also useful. The buried amorphous region represents a region in which the crystalline structure of the active region 240 in FIG. 1 has been transformed into an amorphous state.

As illustrated in FIG. 2, the buried amorphous region 640 extends from the bottom of the vacancy rich region 620 down to the upper boundary of the insulating layer 220. However, this is merely one preferred embodiment and the invention is not limited as such. Within the present invention, the halo region 600 as implanted overlaps the subsequently formed source/drain extension as implanted or introduced. Preferably, the depth of the halo region 600 is deeper than the subsequently formed source/drain extension as implanted. Therefore, it is possible for the buried amorphous region 640 to be shallower than the upper boundary of the insulating layer 220.

In one embodiment, the halo implant 500 may also penetrate through the insulating layer 220 to form an amorphous lower halo region 660 in the base semiconductor substrate 210. Additionally, the halo implant conditions required to create the buried amorphous region 640 may also cause an End of Range (EOR) region 680 to be created below the amorphous region. In the presently described embodiment, the EOR region 680 is created below the lower halo region 660. The EOR region 680 comprises end of range defects such as interstitials.

The halo region 600 may be formed by implanting dopant ions of any suitable chemical composition or conductivity type. Within the embodiment, the energy and dose of the halo implant is selected so as to form a substantially crystalline upper vacancy rich region 620 with excess vacancies and a buried amorphous region 640 below the vacancy rich region 620. In one embodiment, the halo implant dose should not be too low to result in interstitial defects being created in the halo implanted region instead of a combination of an upper crystalline vacancy rich region 620 and a lower buried amorphous region 640 or the dose and/or energy should not be too high to result in the entire halo implanted region being amorphized. Additionally, the energy and dose may also depend to an extent on the actual dopant species being implanted. For example, the required dose to generate vacancies decreases with increasing mass of the dopants. In one embodiment, the halo region 600 has a dopant concentration of between about 5E18 to 1E19 atoms/cm$^3$. Preferably, the halo implant dose is lower than the dose for the source/drain extension implant to be carried out subsequently.

In the presently described embodiment, since we are forming a PFET, the halo implant ions are N-type dopant ions. Non-limiting examples of N-type dopants include Phosphorus, Arsenic or compounds thereof. In one embodiment, the halo dopants are Phosphorus or a compound thereof implanted at an energy of between about 40-60 keV, dose between about 3E14 to 4.1E15 atoms/cm$^2$. Preferably, the halo implant ions are implanted at a high tilt angle of between 30-40 degrees from the axis transverse to the surface of the substrate 200.

For an NFET, the halo implant ions are P-type impurity ions. Non-limiting examples of P-type dopants include Indium, Gallium or compounds thereof. In one embodiment, the halo dopants are Indium or a compound thereof implanted at an energy of between about 80-100 keV, dose between about 7E13 to 9.2E13 atoms/cm$^2$. Preferably, the halo implant ions are implanted at a high tilt angle of between about 30-40 degrees from the axis transverse to the surface of the substrate 200.

The vacancy rich region 620 permits superior electrical activation of at least the dopants used to form the source/drain extension regions in subsequent steps by creating more sites where the dopants can become electrically active. In one embodiment, the excess vacancies in the vacancy rich region 620 permit the number of source/drain extension dopants activated to be above the solid solubility limit.

Figure 8:
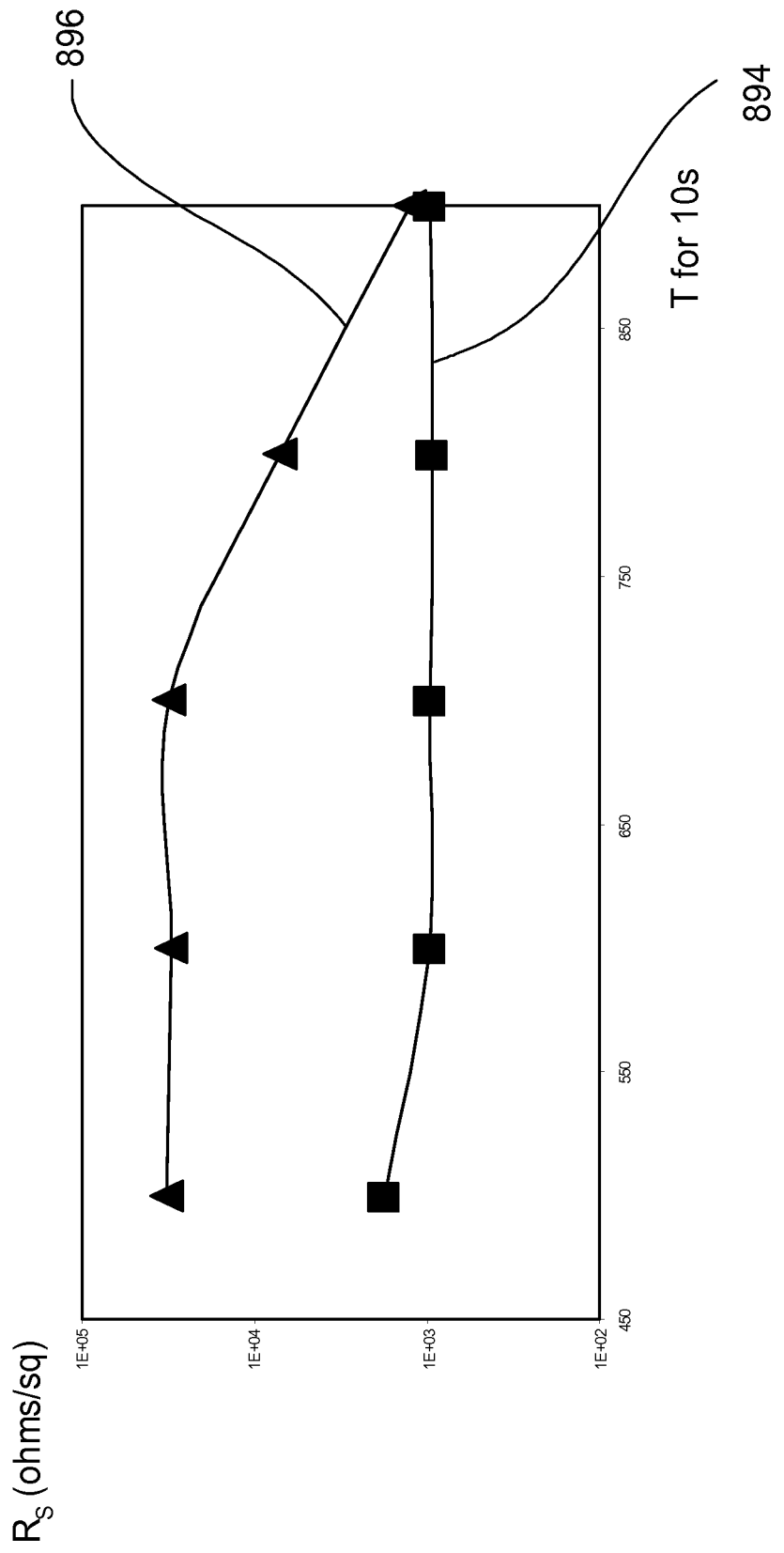
FIG. 8 shows a graph representing measured series resistance of transistors versus temperature according to an embodiment of the invention.

FIG. 8 shows a graph representing measured series resistance ($R_s$) of transistors versus temperature. As shown, line 894 represents results of a p-type transistor with Phosphorus dopants implanted in accordance with one embodiment of the invention (energy=45 keV and dose=3.9E14 atoms/cm$^2$) while line 896 represents results of a p-type transistor without Phosphorus implant. The level (concentration) of activation ($N_s$) above the solid solubility can be estimated using the equation $R_s=1/($integral over depth of $(q.\text{mobility}.N_s))$. From the results, it is clear that the halo implant of the present invention improves the activation above the solid solubility limit.

In embodiments where the source/drain extension regions are formed by implantation, the implantation process often produces defects, known as interstitials in the substrate. These interstitials decrease the electrical activation of the implanted dopant ions by assisting in the segregation and/or clustering of the dopants. The excess vacancies generated in the vacancy rich region 620 during the halo implant help to remove the interstitials thereby increasing source/drain extension dopant activation. Additionally, the removal of interstitials also helps to suppress interstitial aided diffusion mechanisms such as transient enhanced diffusion of at least the dopants used to form the source/drain extension. By reducing lateral and vertical diffusion, there is improved control of source/drain dimensions.

Further, it has been discovered that where the dopant ions in a halo implant are injected at an angle to the transverse axis, vacancies are created in the substrate underneath the gate stack 400. It has also been discovered that this provides a more effective suppression of lateral diffusion compared to when the dopant ions are injected transverse to the surface of the substrate 200. In a preferred embodiment, the tilt angle is between about 30-40 degrees from the axis transverse to the surface of the substrate. Other tilt angles are also suitable depending on factors such as the thickness of the active layer 240 and the parameters of the device being formed. The higher the angle, the more effective the extent of lateral diffusion suppression.

As for the buried amorphous region 640, it helps to reduce channeling during subsequent source/drain extension implantation. By reducing channeling, better control of the source/drain extension junction depth is provided thus shallower source/drain junctions may be formed.

Figure 3:
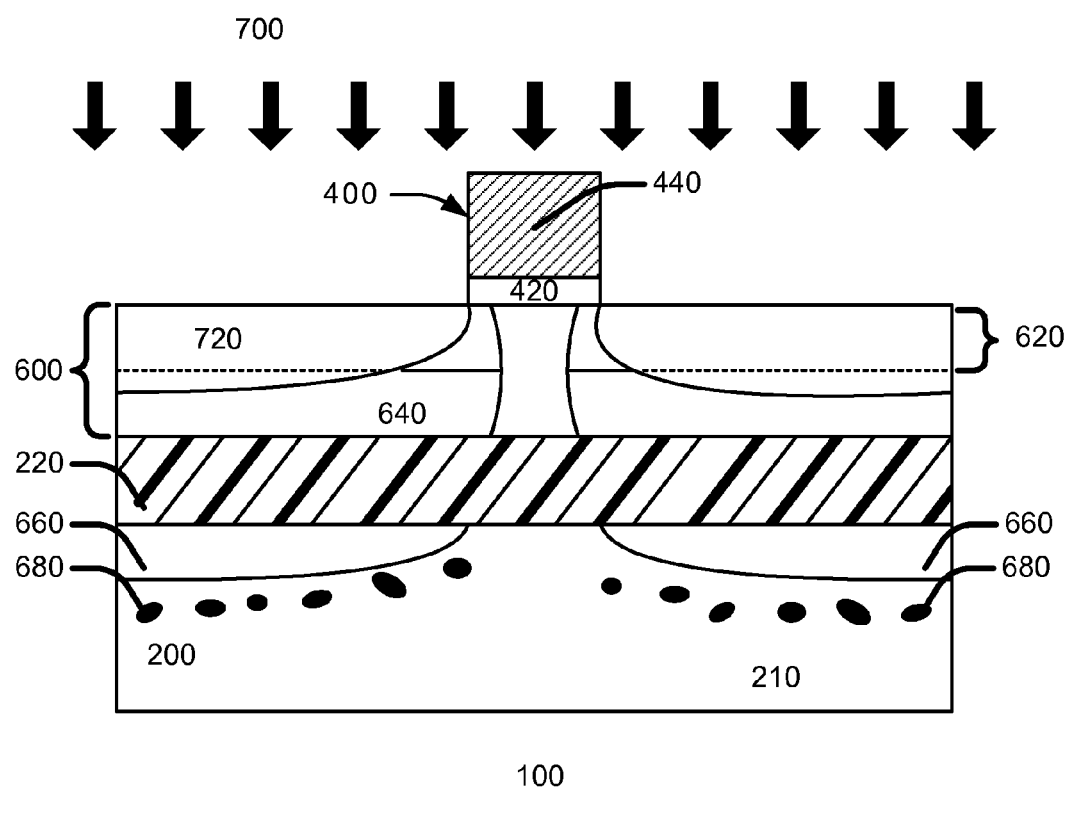

FIG. 3 shows the semiconductor structure 100 of FIG. 2 after a source/drain extension region 720 has been formed in the substrate 200 adjacent to opposite sides of the gate stack 400. In the presently described embodiment, the source/drain extension regions 720 are formed by ion implantation of first dopant ions 700. Alternatively, other methods of introducing dopants such as in-diffusion are also possible. In accordance with the invention, the source/drain extension regions 720 overlap with both the vacancy rich region 620 and the buried amorphous region 640. In a preferred embodiment, the depth of the halo region 600 is deeper than the source/drain extension 720 as implanted.

The source/drain extension regions 720 may be formed by implanting lightly doped P-type impurity ions. Non-limiting examples of P-type dopants include Boron, Aluminum, Gallium, Indium or compounds thereof. In one embodiment, first dopant ions such as Boron or $BF_2$ are implanted at an energy of between about 200 eV to 1 keV and at a dose of between about 5E14 to 2E15 atoms/cm$^2$.

For an NFET, the first dopant ions 700 are lightly N-type impurity ions. Non-limiting examples of N-type dopants include Phosphorus, Arsenic or compounds thereof. In one embodiment, the first dopant ions of Phosphorus implanted at an energy of between about 200 eV to 1 keV, dose between about 5E14 to 2E15 atoms/cm$^2$.

Figure 6:
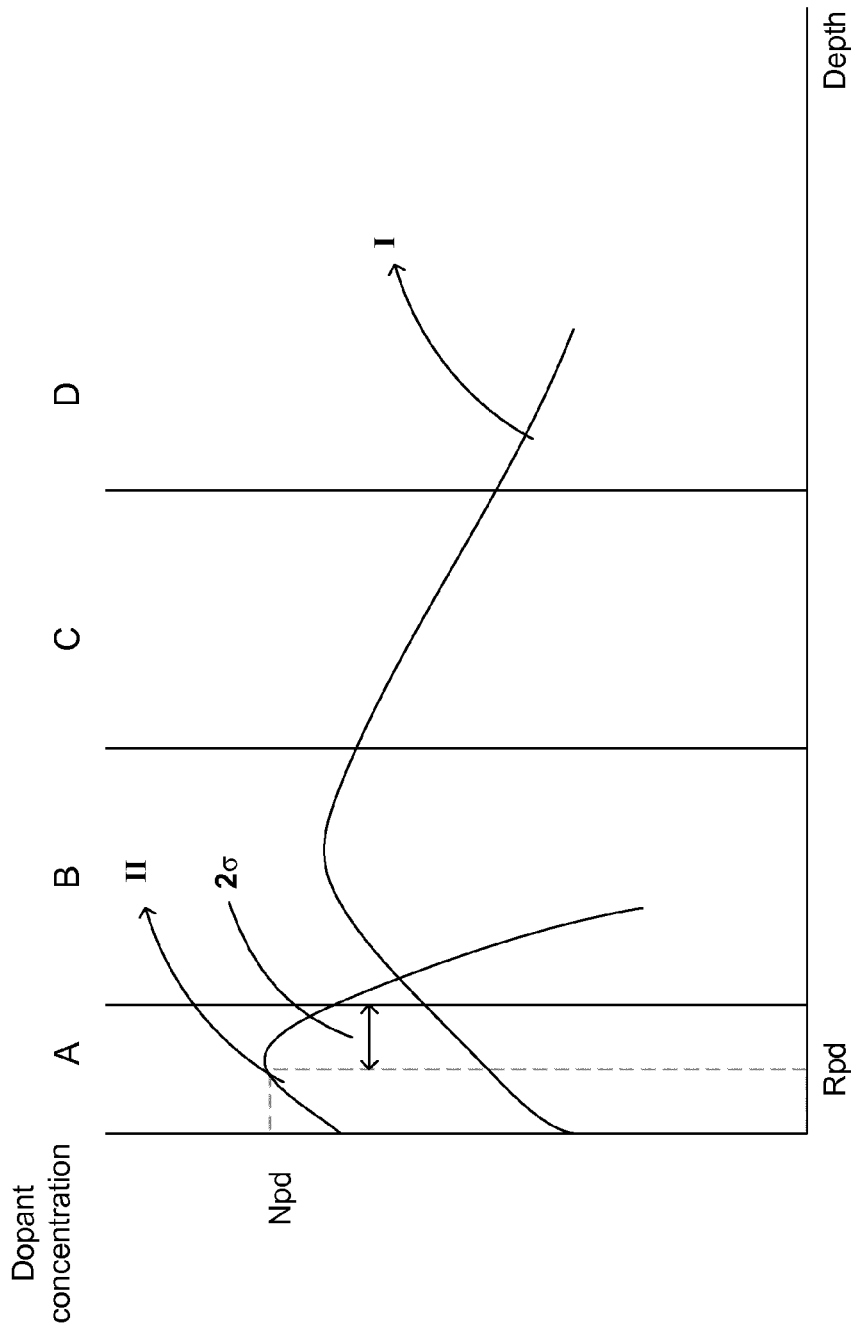
FIG. 6 is a schematic graph depicting the dopant concentration profiles for halo dopant ions (Curve I) and source/drain extension dopant ions (Curve II) with respect to various regions in the substrate 200.

In accordance with one embodiment of the invention, as illustrated in FIG. 6, implanting halo dopant ions into preselected regions of, for example, an SOI substrate produces a concentration profile depicted by Curve I. Implanting source/drain extension dopant ions into preselected regions of the substrate produces a concentration profile Curve II which has its peak concentration Npd at a depth of Rpd, the projected range. The depth illustrated in FIG. 6 is measured from the surface of the substrate. In one embodiment, dopant concentration is measured in terms of number per cm$^3$ while depth is measured in nanometers. The spread of the source/drain extension dopant profile (Curve II) is measured by the parameter $S_o$ which is defined as the depth at which the drain extension dopant concentration falls to $Npd/e^{0.5}$. Portions of the graph indicated as A, B, C and D represent the vacancy rich region 620, buried amorphous region 640, insulating layer 220 and base semiconductor substrate 210 respectively. For non-SOI applications, region C is eliminated.

In one embodiment, the conditions of the halo and source/drain extension implant are chosen such that depth of the vacancy rich region A is between about 1 to 3 times the projected range (Rpd) of the source/drain extension region. In another embodiment, the depth of the vacancy rich region A is between about 1 to 10 nm. Preferably, the depth of the vacancy rich region A is between about Rpd to Rpd+2$S_o$. The tail end of the source/drain extension profile (Curve II) should be within the amorphous region B because the amorphous region reduces channeling effects whereby implanted ions penetrate to a greater depth than projected. By reducing channeling effects, shallower source/drain extension regions may be formed.

Figure 4A:
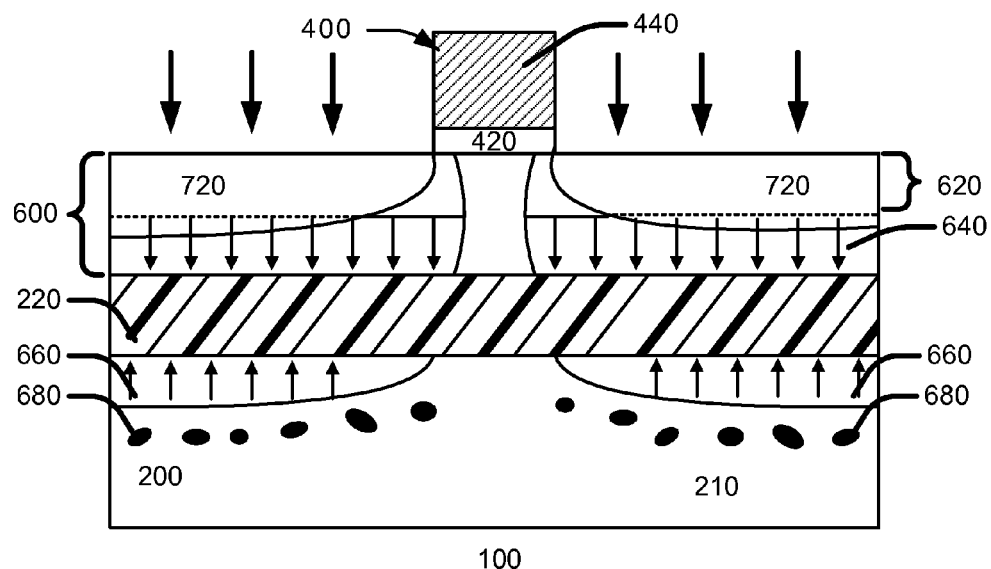
Figure 4B:
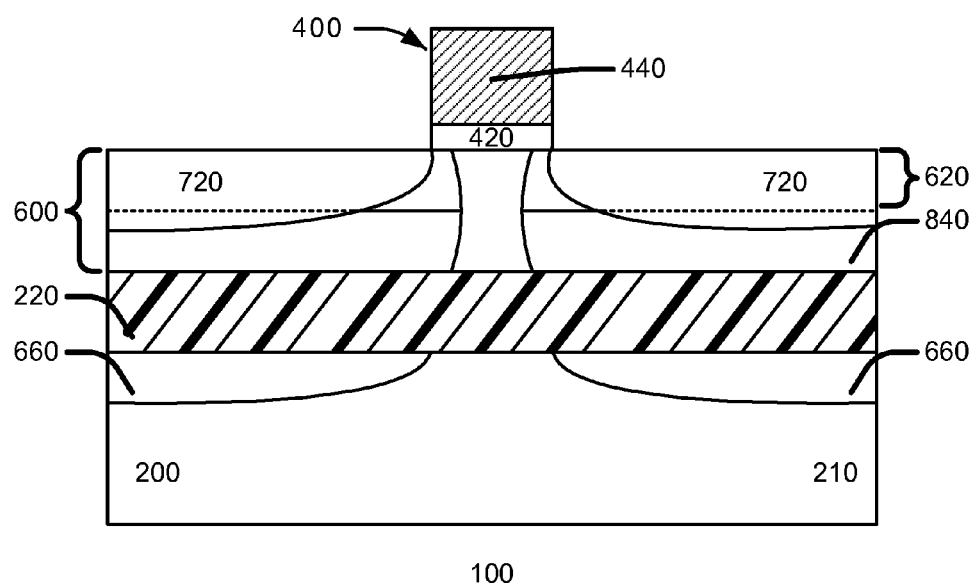

In FIG. 4A, the halo implant and source/drain extension dopants are electrically activated by annealing. The buried amorphous region 640 in the semiconductor structure 100 of FIG. 3 is also re-crystallized concurrently to form a buried recrystallized region 840 as shown in FIG. 4B.

During the anneal process, crystalline silicon regions such as the vacancy rich region 620 in FIG. 4A acts as a seed layer for the re-crystallization of the buried amorphous region 640. In the presently described embodiment, the buried amorphous region 640 re-grows by "reverse" solid phase epitaxy whereby the buried amorphous region 640 re-crystallizes by growing downwards starting from the bottom of the vacancy rich region 620 towards the insulating layer 220 interface. This regrowth advantageously helps to sweep residual defects in the buried amorphous layer 640 to the insulating layer 220 interface. In one embodiment, the lower halo region 660 also re-crystallizes in an upward direction from the base semiconductor substrate 210 towards the bottom of the insulating layer 220. During the anneal process, the EOR defects 680 such as interstitials also diffuse outwards but the insulating layer 220 serves as a barrier to prevent them from reaching the active region 240 where they may have deleterious effects. These deleterious effects include deactivation of the dopants in the active region 240 such as the source/drain extension dopants and enhancing the diffusion of dopants such as Boron that are transported via an interstitialcy mechanism. The latter impacts the ability to control junction depth of the source/drain extension region. Therefore, hybrid substrates comprising an insulating layer 220 tend to observe more superior performance compared to bulk semiconductor substrates.

It is possible to have the annealing process carried out anytime after the source/drain extension implant. The annealing process can be dedicated anneal steps or subsequent anneals carried out during standard processing steps to complete fabrication of the semiconductor structure. Additionally, electrical activation of the halo implant and source/drain extension dopants and re-crystallization of the buried amorphous region can also be achieved in separate anneal steps. In a preferred embodiment, the annealing process is a spacer anneal. That is, the anneal occurs during the deposition of one or more dielectric layers to form spacers on the sidewalls of the gate stack 400 which will be described in the succeeding paragraphs. Other annealing methods not limited to Rapid Thermal Anneal (RTA), Laser Spike Anneal (LSA) or Thermal Anneal are also suitable. In one embodiment, the annealing process is a low temperature anneal at a temperature between about 600 and 800 degrees C. In another embodiment, a spike anneal at a temperature of between about 1000 to 1100 degrees C. for about less than 10 seconds is carried out.

As discussed earlier, the excess vacancies in the vacancy rich region 620 facilitates superior electrical activation of the dopants used to form the source/drain extension regions. Additionally, the excess vacancies also remove interstitials thereby helping to suppress interstitial aided diffusion of source/drain extension and/or source/drain dopants during anneal. Where the dopant ions in the halo implant are injected at an angle to the transverse axis, excess vacancies are also created in the substrate underneath thereby further providing more effective suppression of lateral diffusion. By reducing diffusivity of the dopants, there is improved control of source/drain extension dimensions and accordingly shallower junctions and reduced short channel effect are possible. Correspondingly, the source/drain extension regions 720 in FIG. 4B have little expansion compared to the as-implanted profile shown in FIG. 3.

Figure 7:
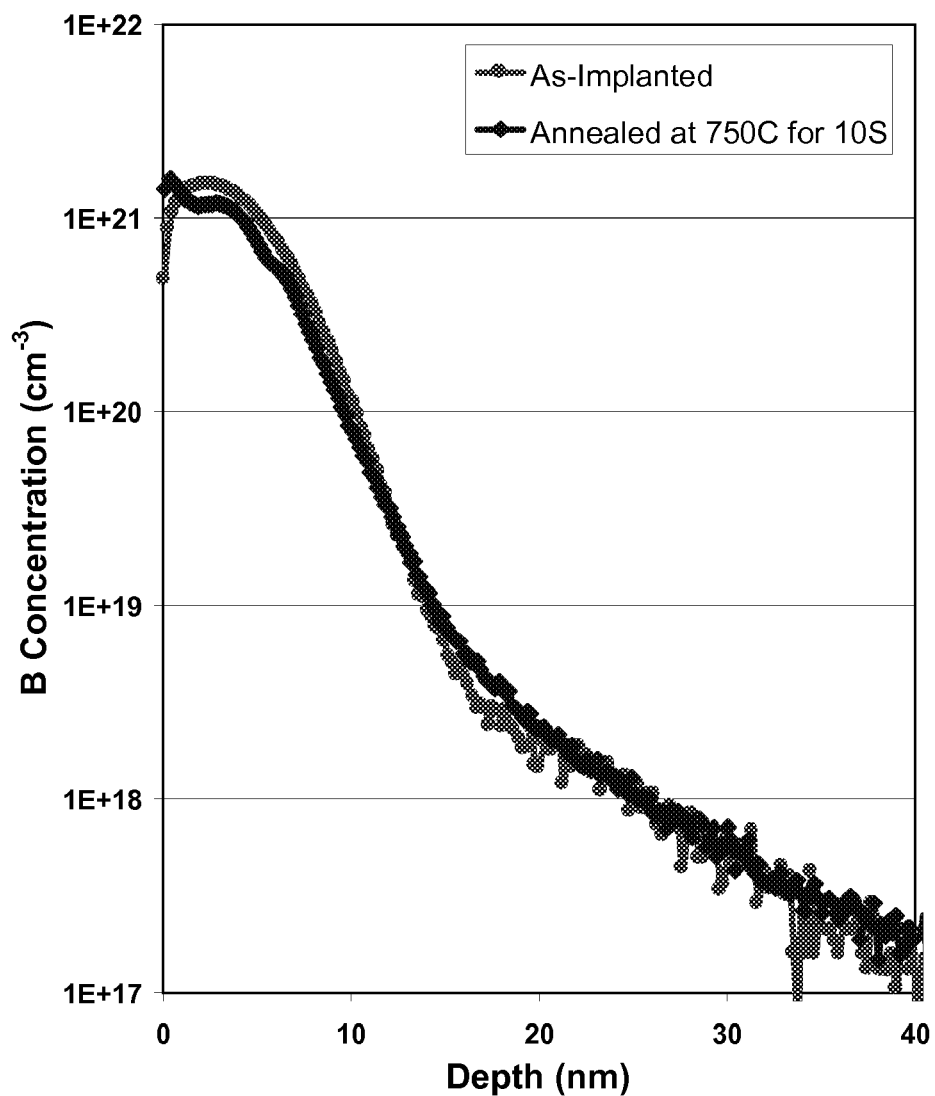
FIG. 7 shows the concentration profiles for a Boron source/drain extension as implanted and after anneal according to an embodiment of the invention.

This result is illustrated in FIG. 7 which shows the dopant concentration profile for a Boron doped source/drain extension both as implanted and after anneal in an embodiment of the invention. The Boron doped source/drain extension is formed such that as implanted it overlaps with both the vacancy rich and the buried amorphous regions of a halo region formed by an optimized Phosphorus halo implant. As observed in FIG. 7, the Boron extension undergoes very little diffusion with respect to the as implanted profile.

Figure 5:
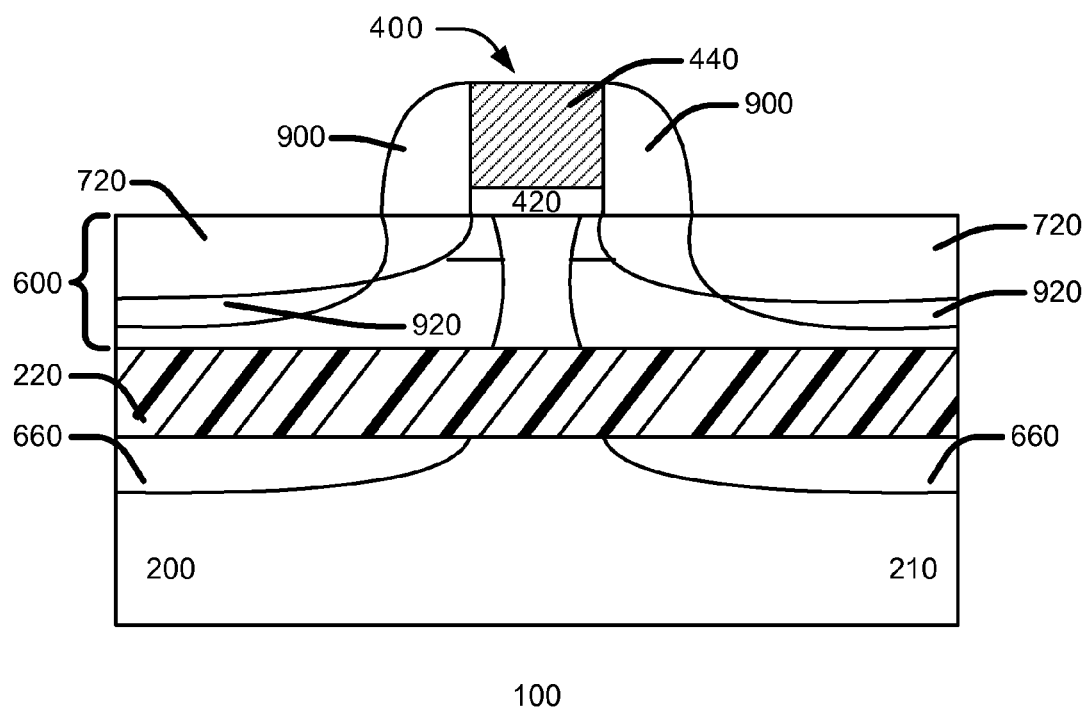

FIG. 5 shows the results of forming of spacers 900 on the sidewalls of the gate stack 400. Second dopant ions are then implanted into the substrate using the spacers 900 as a mask. Thus source and drain regions are formed in the substrate on respective opposite sides of the gate stack 400 spaced from the edge of the gate stack by the spacers 900. The second diffusion regions 920 are preferably highly doped and have the same impurity type doping as the source/drain extension region 720 but opposite impurity doping type to the halo region 600. In a preferred embodiment, the source/drain regions at least partially overlap the vacancy rich region 620.

Each of the foregoing spacer 900 and source/drain region 920 formation are generally conventional in the semiconductor fabrication art.

For example, the spacers 900 are formed by depositing one or more dielectric layers on the semiconductor structure and etching the dielectric layer such that only the material adjacent to the gate stack 400 remains. Non-limiting examples of dielectric materials include silicon nitride, silicon oxide, TEOS, silicon oxynitride or combinations thereof Apart from the spacer profile illustrated in FIG. 5, other types of spacers such as L-shaped spacers, disposable spacers, multiple spacers, offset spacers are also suitable. Accordingly, embodiments of the present invention may utilize different doping profiles.

In the presently described embodiment, since we are forming a PFET, the second dopant ions implanted are P-type. For an NFET, the second dopant ions are N-type.

Thereafter, a S/D anneal is carried out to anneal/activate the S/D regions 920. It may be possible to use this S/D anneal in place of the post source/drain extension anneal to recrystallize the buried amorphous region 640.

The semiconductor structure may be further processed using standard fabrication techniques to form the IC. For example, silicide regions, an interlevel dielectric layer, contacts, inter-metal dielectric layers and interconnect can be formed.

The semiconductor structure of the FIG. 5 is formed using a method that provides a halo region in the substrate adjacent to opposing sides of a gate stack. The halo region comprising an upper vacancy rich region 620 and a lower buried amorphous region 640. A source/drain extension region 720 overlaps both the vacancy rich region 620 and a lower buried amorphous region is then formed.

The inventors have discovered that the halo implant can be advantageously optimized to generate an upper vacancy rich region 620 with excess vacancies and a lower buried amorphous region. As discussed in the preceding paragraphs, the vacancy rich region improves the activation of the dopants used to form the source/drain extension region. The vacancy rich region also reduces the extent of interstitial enhanced the source/drain extension dopant diffusion during subsequent processing steps. In one embodiment, the extent of source/drain diffusion during subsequent processing steps is also reduced. The buried amorphous region on the other hand reduces the extent of channeling.

Since the halo implant is one of the standard semiconductor processing steps, the present invention achieves the above advantages with no additional process steps incurred. Additionally, as compared to methods where it is also not necessary to form a mask for blocking the gate stack compared to instances where ions not part of the standard process flow are used for defect engineering. Finally, to the extent that the ions in the halo implant are injected at an angle to the axis transverse to the surface of the substrate, the halo dopants are placed under the gate stack. This results in a more effective suppression of lateral diffusion.

The preferred embodiment of the invention is illustrative of the invention rather than limiting of the invention. It is to be understood that revisions and modifications may be made to methods, materials, structures and dimensions of a semiconductor structure while still providing a semiconductor that fall within the scope of the included claims. All matters hitherto-fore set forth herein or shown in the accompanying drawings are to be interpreted in an illustrative and non-limiting sense.

What is claimed is:

1. A method for forming a device comprising:
providing a substrate;
implanting first type dopants in the substrate to form a first doped region, wherein the first doped region as formed includes
a crystalline vacancy rich region, and
a buried amorphous region, wherein the vacancy rich region extends from the surface of the substrate to a top of the buried amorphous region;
implanting second type dopants having a second polarity into the substrate to form a second doped region, wherein the second doped region is contained within the first doped region and overlaps both the vacancy rich and buried amorphous regions, and a peak second dopant concentration is located at a depth Rpd from the surface of the substrate, wherein the vacancy rich region has a depth that is greater than or equal to Rpd;
recrystallizing the buried amorphous regions; and
activating the second type dopants in the second doped region, wherein the crystalline upper vacancy rich region has a sufficient amount of excess vacancies to improve electrical activation in the second doped region above the solid solubility limit.

2. The method in claim 1 wherein the first doped region comprises a halo region.

3. The method in claim 1 wherein the second doped region comprises a diffusion region.

4. The method in claim 1 wherein implanting the first type dopants comprising injecting dopants into the substrate at angle to an axis transverse to the surface of the substrate.

5. The method in claim 1 wherein the vacancy rich region has a depth of about Rpd to 3 Rpd.

6. The method in claim 1 wherein the vacancy rich region has a depth of about Rpd to 2 $S_o$, $S_o$ being the depth where the dopant concentration drops to $1/e^{0.5}$ of the maximum dopant concentration.

7. The method in claim 1 wherein the vacancy rich region has a depth of about 1 to 10 nanometers.

8. A method for forming a device comprising:
providing a substrate;
implanting first type dopants in the substrate to form a first doped region, wherein the first doped region as formed includes
a crystalline vacancy rich region, and
a buried amorphous region, wherein the vacancy rich region extends from the surface of the substrate to a top of the buried amorphous region;
implanting second type dopants having a second polarity into the substrate to form a second doped region, wherein the second doped region overlaps both the vacancy rich and buried amorphous regions;
activating the second type dopants in the second doped region, wherein the crystalline upper vacancy rich region has a sufficient amount of excess vacancies to improve electrical activation in the second doped region above the solid solubility limit.

9. The method in claim 8 wherein implanting the first type dopants in the substrate comprises forming first doped regions adjacent to a gate stack on the substrate.

10. The method in claim 9 wherein the first doped regions are isolated from each other by a portion of the substrate under the gate stack.

11. The method in claim 10 wherein implanting the second type dopants into the substrate comprises forming second doped regions which are contained within the first doped regions.

12. The method in claim 11 wherein implanting the first type dopants comprises implanting dopants at a dose that is less than a dose used in forming the second doped regions.

13. The method in claim 8 wherein the second type dopants comprise a peak concentration located at a depth Rpd from the surface of the substrate, wherein the vacancy rich region has a depth that is greater than or equal to Rpd.

14. The method in claim 11 wherein the substrate comprises a buried insulating region, the first and second doped regions being located above the insulating region.

15. The method in claim 14 wherein the buried amorphous region abuts the buried insulating region.

16. The method in claim 14 wherein the buried insulating region is a buried nitride or buried oxide layer.

17. The method in claim 8 wherein:
the substrate comprises a crystalline on insulator substrate having a crystalline surface substrate separated by a crystalline bulk substrate by an insulator layer;
the first doped regions extend below the insulator layer into the bulk substrate, wherein
the crystalline upper vacancy rich region is disposed in the surface substrate, and
the lower buried amorphous region extends from the surface substrate into the bulk substrate; and
the second doped regions are disposed in the surface substrate.

18. The method in claim 8 wherein the first doped region comprises a halo region.

19. The method in claim 8 wherein the second doped region comprises a diffusion region.

20. A method for forming a device comprising:
providing a substrate having a buried insulating region;
implanting first type dopants in the substrate to form a first doped region, wherein the first doped region as formed includes
a crystalline vacancy rich region, and a buried amorphous region, wherein the vacancy rich region extends from the surface of the substrate to a top of the buried amorphous region;

implanting second type dopants having a second polarity into the substrate to form a second doped region, wherein the second doped region overlaps both the vacancy rich and buried amorphous regions;

activating the second type dopants in the second doped region, wherein the crystalline upper vacancy rich region has a sufficient amount of excess vacancies to improve electrical activation in the second doped region above the solid solubility limit.

* * * * *